United States Patent [19]
Wang et al.

[11] Patent Number: 5,684,737
[45] Date of Patent: Nov. 4, 1997

[54] SRAM CELL UTILIZING BISTABLE DIODE HAVING GESI STRUCTURE THEREIN

[75] Inventors: Kang L. Wang, Santa Monica; Xinyu Zheng, Los Angeles, both of Calif.; Timothy K. Carns, Boise, Id.

[73] Assignee: The Regents of the University of California, Oakland, Calif.

[21] Appl. No.: 569,848

[22] Filed: Dec. 8, 1995

[51] Int. Cl.$^6$ .................. G11C 11/36; G11C 11/34; H01L 29/06; H01L 27/11
[52] U.S. Cl. .................. 365/175; 365/182; 257/15; 257/903
[58] Field of Search .................. 365/175, 182, 365/243; 257/903, 904, 15

[56] References Cited

U.S. PATENT DOCUMENTS 3,626,257 12/1971 Esaki et al. .................. 257/15
5,032,891 7/1991 Takagi et al. .................. 365/175

Primary Examiner—David C. Nelms
Assistant Examiner—Trong Quang Phan
Attorney, Agent, or Firm—Townsend and Townsend and Crew LLP; Henry K. Woodward

[57] ABSTRACT

A static random access memory (SRAM) cell includes a bistable diode and a load device serially connectable between two voltage potentials (VDD, Ground) with a gate device (field effect transistor) connected between a bit line and a common terminal of the bistable diode and load device and a control terminal of the gate device connected to a word line. The bistable diode includes a GeSi structure between a p-doped semiconductor region and a spaced n-doped semiconductor region. The GeSi structure can be a GeSi/Si superlattice and a δ-doped tunnel junction, a $Ge_xSi_{1-x}$ multiple well structure, or a δ-doped tunnel junction.

12 Claims, 11 Drawing Sheets

State I, diode is off

State II, diode is on

SRAM CELL UTILIZING BISTABLE DIODE HAVING GESI STRUCTURE THEREIN

BACKGROUND OF THE INVENTION

This invention relates generally to static random access memories (SRAM) and, more particularly, the invention relates to an SRAM cell which utilizes a GeSi/Si bistable diode as a storage element.

SRAM is very important for today's and future computers. To meet the increasing demand for large volume, high speed SRAMs, two approaches can be taken at the device level. The first one is to scale device dimensions down which has been proven effective but costly from an economic point of view. The second approach is to simplify the architecture of SRAM cell by introducing a functional device as the storage element. A conventional CMOS SRAM cell containing six MOSFETs is shown in FIG. 1. Among the six transistors of the cell, four MOSFETs 10, 11, 12, 13 are made up to form a flip-flop whose function is to store binary code "0" or "1" and two MOSFETs 14, 15 function as bit and bit pass transistors driven by a word line. Such a cell occupies four or more times chip area as compared with the DRAM (Dynamic Random Access Memory) cell. If the flip-flop is replaced by a functional device, with or without a load element, a significant reduction in the number of both devices and interconnection lines will be attained, which has both the benefit of increasing the cell density (volume) and improving the speed performance. To achieve the goal, the use of dual-state resonant tunneling diodes (with an N-shaped negative differential resistance) or delta-doped (δ-doped, planar doped) multi-state devices (with an S-shaped negative differential resistance) as the storage device has been previously proposed for a simplified SRAM cell. Unfortunately, as shown in FIG. 2(a) and FIG. 3(a), the realistic operating performances of these devices are far from the anticipated ones, which are shown in FIG. 2(b) and FIG. 3(b). The position of the operation points A and B labeled in FIG. 2(a) and FIG. 3(a) indicates that the simplified cell using either of these two devices will have a small output voltage swing and dissipate a large power. The cell using a δ-doped multi-state device will also be too slow due to the long excess carrier lifetime in the δ-doped layers. Above all, none of the dual or multi-state devices published hitherto was demonstrated on crystalline silicon. For these reasons, it is impossible to use these devices to construct an SRAM competitive to the conventional CMOS SRAM in cell density, speed, power dissipation and manufacturing feasibility.

To make the idea of the simplified SRAM cell practical, the storage device of the simplified cell should be a dual or multi-state device with performance close to either of the ideal performance shown in FIG. 2(b) or FIG. 3(b). For the latter case, the critical issues for the SRAM application are: (1) an OFF-state with a very low leakage current over a voltage range from 0 to, for example, 2–4 V, depending on the power supply voltage, (2) an ON-state with a high conductance, a small voltage drop, $V_{on}$, and a small maintaining current, $I_{main}$, (3) an intrinsically high switching speed, and (4) a technology compatible with CMOS devices.

SUMMARY OF THE INVENTION

In accordance with the invention, a simplified SRAM cell is provided which utilizes a GeSi/Si bistable diode as the storage element. A load element and a gate transistor complete the cell with the load element and bistable diode serially connected between two voltage levels ($V_{DD}$, ground), and the gate transistor is connected between a bit line and the common terminal of the load element and bistable diode.

In one embodiment, the bistable diode includes a GeSi/Si superlattice and an δ-doped tunnel junction having a pair of closely spaced p+ and N+ δ-doped layers and an n-type region.

In another embodiment, the GeSi/Si superlattice is replaced by a $Ge_xSi_{1-x}$ multiple well structure. In still another embodiment, one or more δ-doped tunnel junctions are employed with each tunnel junction including an n-type δ-doped layer and a p-type δ-doped layer. These structures allow the bistable device to stay at either a high resistance "off" state or a high conductance "on" state under a forward bias.

The invention and objects and features thereof will be more readily apparent from the following detailed description and appended claims when taken with the drawings.

DETAILED DESCRIPTION OF PREFERRED EMBODIMENTS

The drawings illustrate a simplified SRAM cell which can be used to construct a high density, high speed and low power dissipation SRAM. The key device in the cell is a forward biased GeSi/Si bistable diode which distinguishes it from the other dual or multi-state devices in meeting the demands mentioned above.

The structure of the SRAM cell is shown in FIG. 4 which includes a forward biased bistable diode 40, which is used as the storage device, a gate n-MOSFET 42 and a load element 44. The gate transistor 42 has a negative substrate bias because a negative pulse is needed in the process of writing "1" into the cell. The load element 44 can be either a poly-silicon resistor (FIGS. 4A, 4C) or a depletion mode TFT (Thin Film Transistor) (FIGS. 4B, 4D), fabricated on the top of the cell. In FIG. 4, four configurations of the cell are used as examples to illustrate the possible combinations. Other kinds of devices or elements can also be adopted as the load element as long as the dual states and a low power dissipation features of the cell are preserved.

Figure 5:
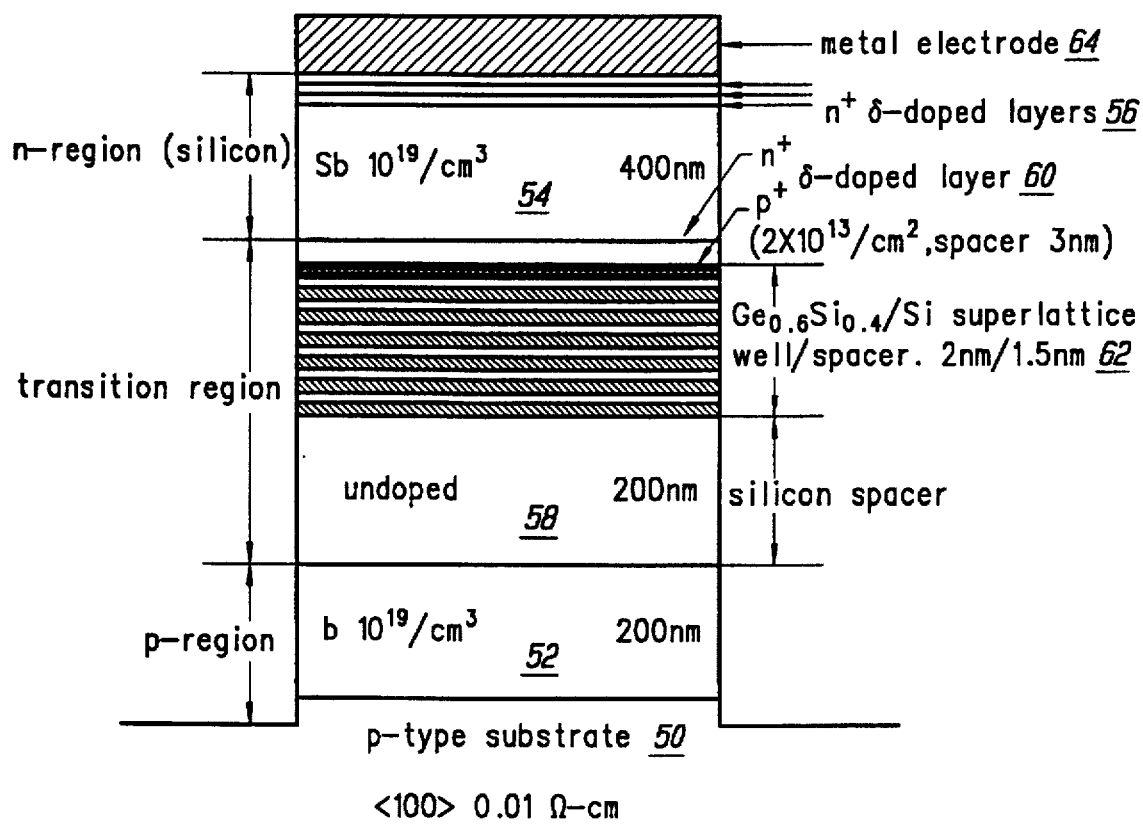
FIG. 5 illustrates the structure of a bistable diode in accordance with one embodiment of the invention.
Figure 6:
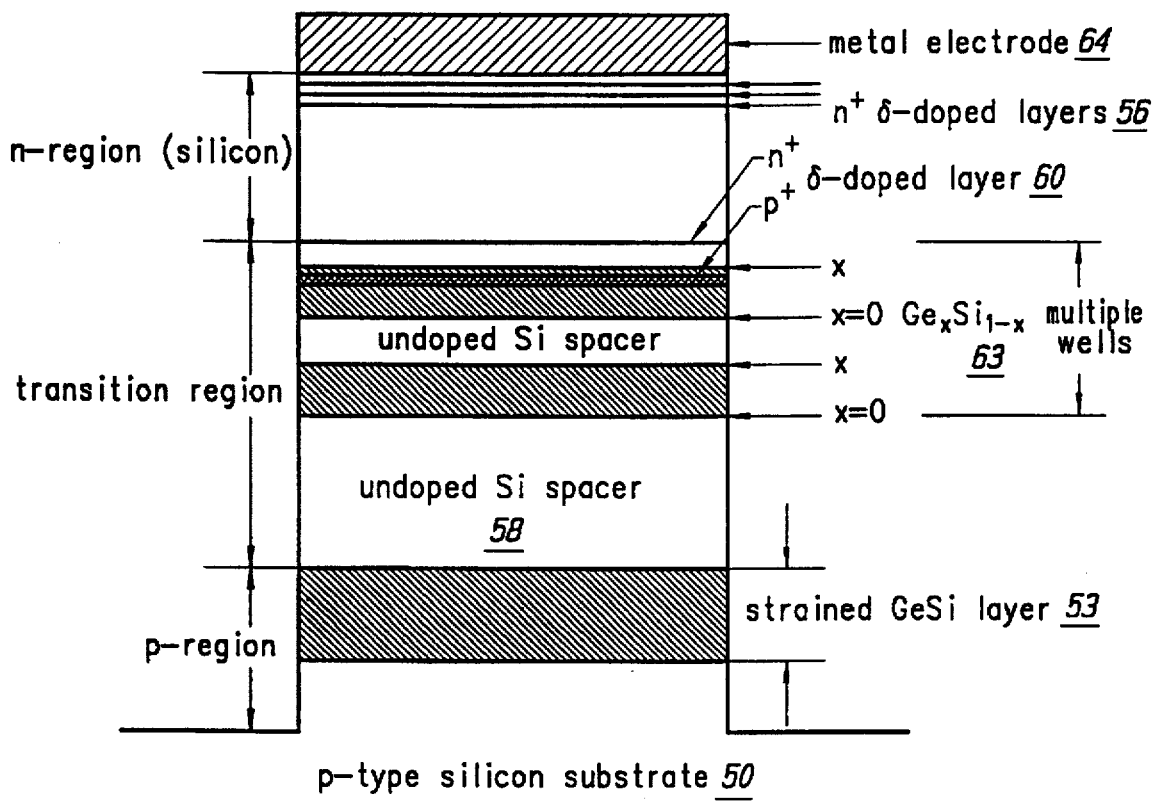
FIG. 6 illustrates the structure of a bistable diode in accordance with another embodiment of the invention.

Shown in FIG. 5 and FIG. 6 are the typical structures of the bistable diode 40. The one shown in FIG. 5 is the structure first demonstrated by us and that shown in FIG. 6 is a modified structure for high speed application. Both of them use a p-type substrate 50. Inverse structures on n-type substrate are also feasible and comprise part of the invention covered by the disclosure. We will describe the structure shown in FIG. 5 and its I–V characteristics first. Then the dynamic characteristics of the bistable diode will be discussed for the structure shown in FIG. 6.

The structure shown in FIG. 5 was grown by the MBE (Molecular Beam Epitaxy) technique. Other similar techniques, e.g., UHVCVD (Ultra-High Vacuum Chemical Vapor Deposit), can also be used for the material growth. The two sides of the bistable diode were heavily doped p-type (anode) and n-type (cathode) regions 52, 54, both with a dopant concentration around $10^{19}$ cm$^{-3}$. The n-region is 400 nm thick and a few n+ $\delta$-doped layers 56 are inserted underneath its surface to improve the ohmic contact to the metal electrode. Between the p-region and the n-region, there is a transition region including undoped silicon spacer 58 in which a $\delta$-doped tunnel junction 60 and a strained Ge$_{0.6}$Si$_{0.4}$/Si superlattice structure 62 are inserted. The $\delta$-doped tunnel junction includes a pair of closely placed p+ and n+ $\delta$-doped layers, both with a 2D doping density of $2\times10^{13}$ cm$^{-2}$. The n+ $\delta$-doped layer is placed at the edge of the n-type region. The p+ $\delta$-doped layer is at the center of the first GeSi well of the superlattice and is 3 nm apart from the n+ $\delta$-doped layer. The Ge$_{0.6}$Si$_{0.4}$ well width and the silicon spacer thickness of the 10 period superlattice were 2 nm and 1.5 nm, respectively. Below the GeSi/Si superlattice is a 200 nm thick undoped buffer layer 58 and a p+ buffer layer 52 with a boron concentration of $10^{19}$ cm$^{-3}$. A metal electrode 64 is placed on the $\delta$-doped layers 56.

Figure 1:
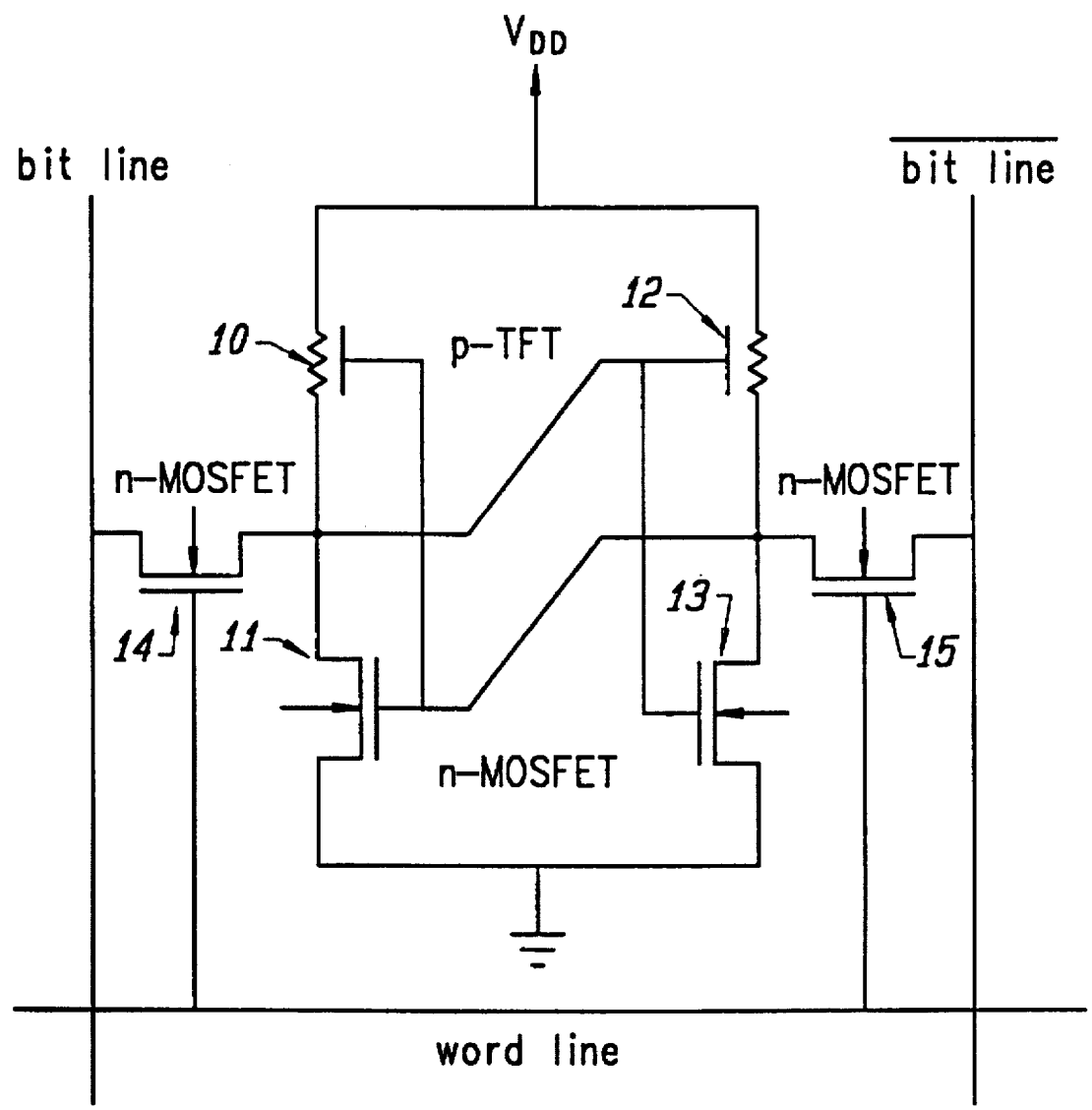
FIG. 1 is a schematic of a conventional six transistor CMOS SRAM cell.
Figure 2A:
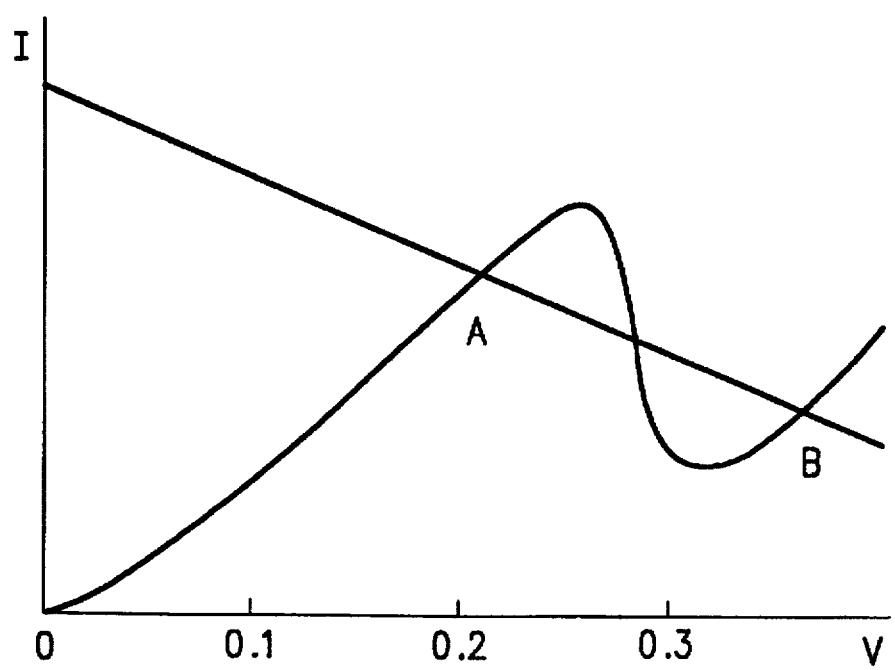
FIGS. 2A, 2B illustrate typical and ideal I–V characteristics of a resonant tunneling diode (RTD).
Figure 2B:
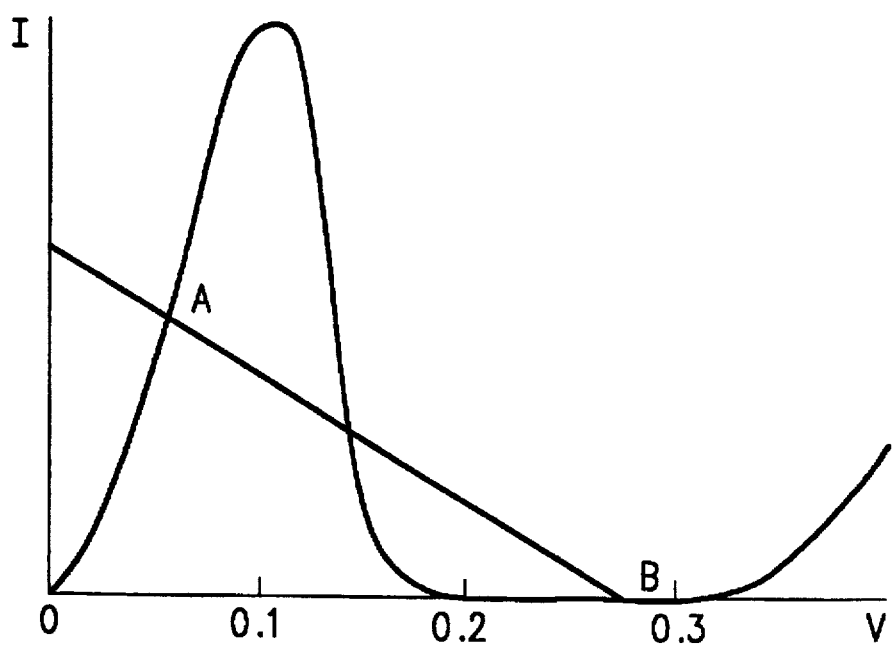
Figure 3A:
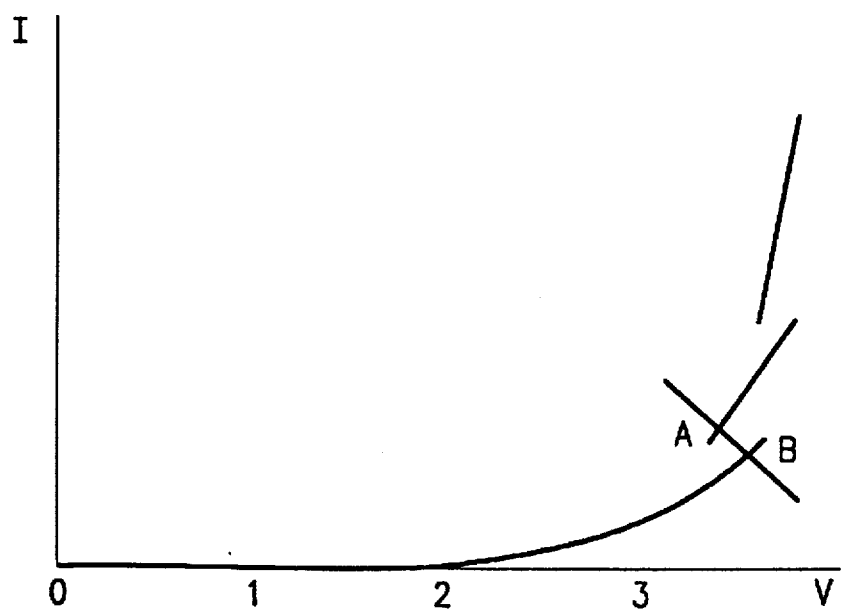
FIGS. 3A, 3B illustrate typical and ideal I–V characteristics of a δ-doped multi-state device and of a device with an S-shaped negative resistance for an SRAM application.
Figure 3B:
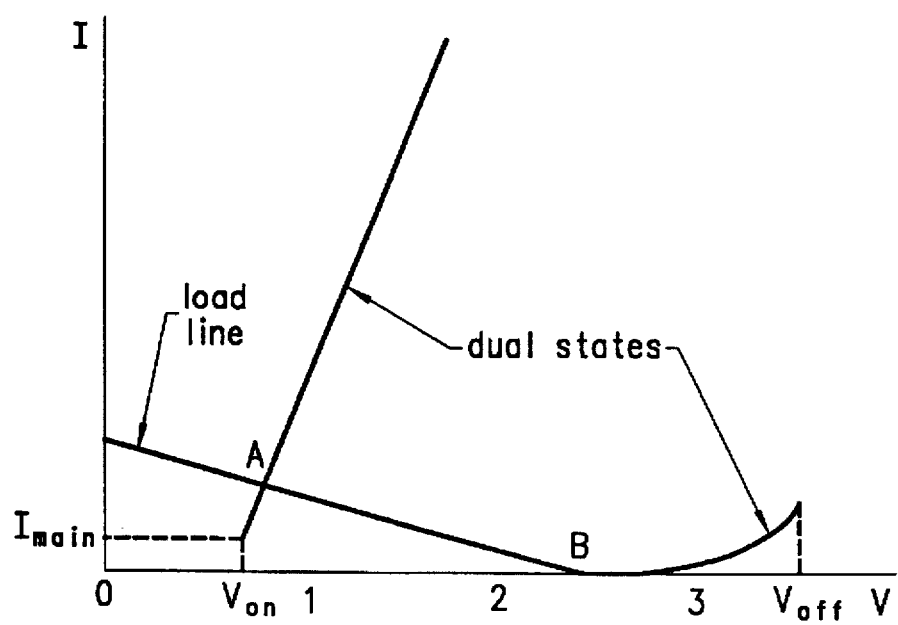
Figure 4A:
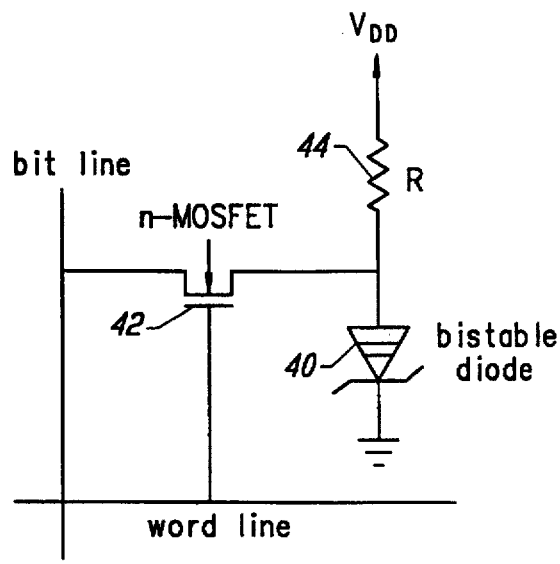
FIGS. 4A–4D are schematics of SRAM cells in accordance with the invention.
Figure 4B:
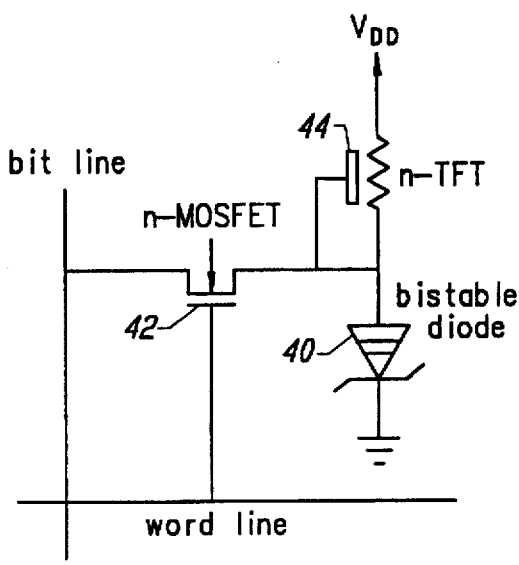
Figure 4C:
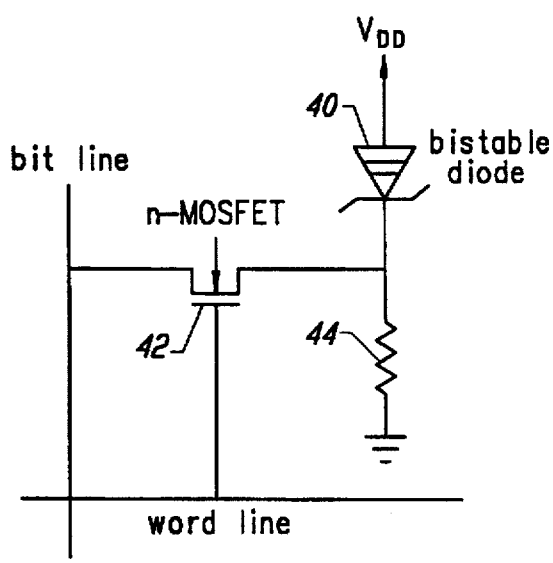
Figure 4D:
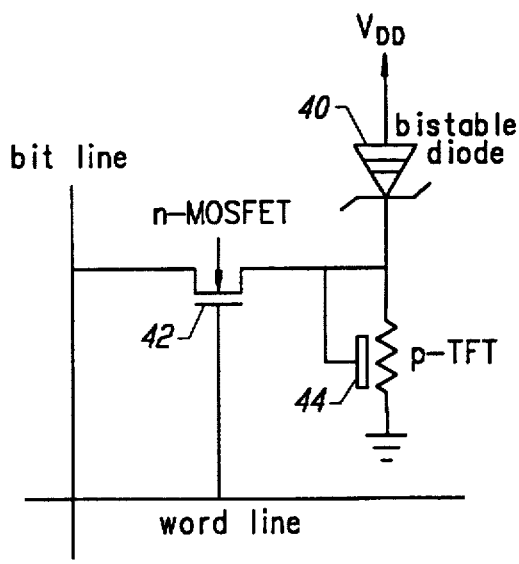
Figure 7:
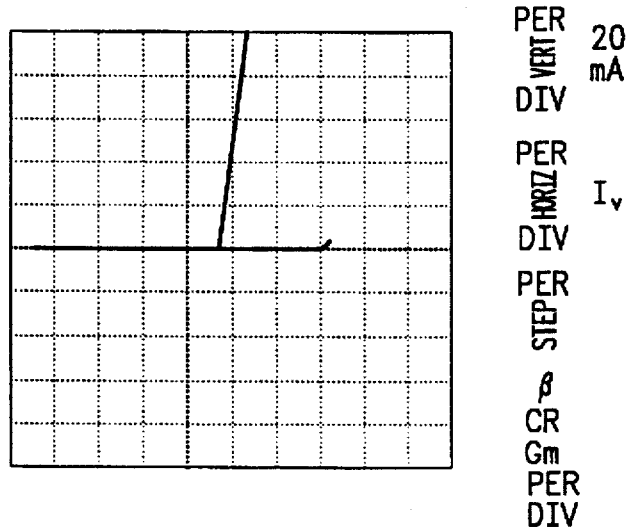
FIG. 7 illustrates I–V characteristics of the GeSi/Si bistable diode of FIG. 6.

Room temperature I–V characteristics of the GeSi/Si bistable diode is shown in FIG. 7. The two branches of the forward bias characteristics indicate the existence of two stable states in a certain range of forward bias. The conductance contrast between the on state (state II) and the off state (state I) is over $10^6$. The transition voltage of state I, $V_{off}$, and the minimum voltage drop of state II, $V_{on}$, are 3.2 V and 0.8 V, respectively. The maintaining current $I_{main}$ is too small to show on the figure. The reverse breakdown voltage is about 16 V. Only part of the reverse characteristics is displayed in FIG. 6 because the diode is always operated under a forward bias in the SRAM application. The 77K measurement gives a similar I–V curve but much smaller $I_{main}$. Comparing with the ideal characteristics shown in FIG. 3(b), one finds that the bistable diode is a good candidate for a storage element in an SRAM cell.

Figure 8A:
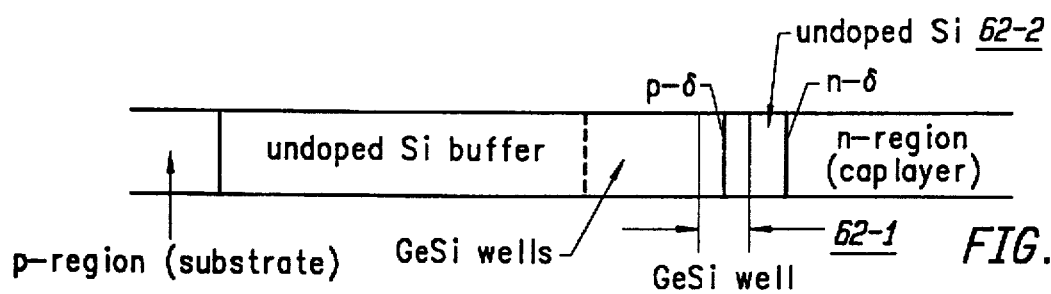
FIG. 8A is a representation of the bistable diode of FIG. 5.
Figure 8B:
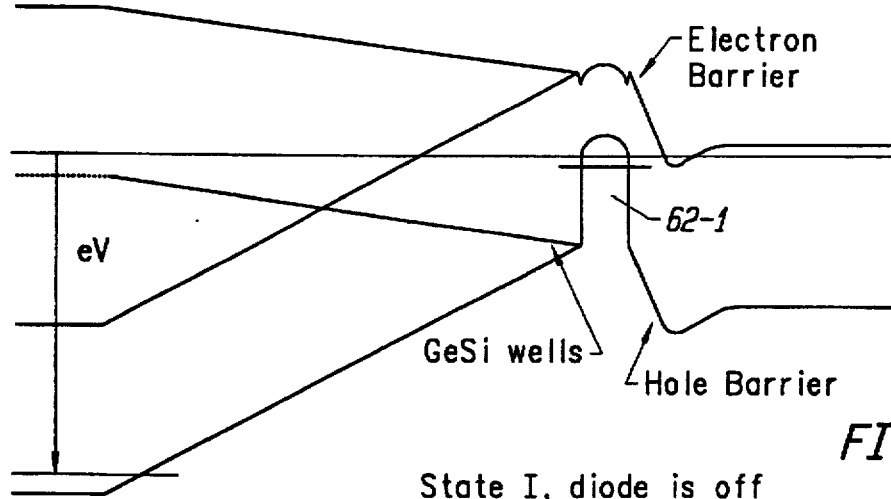
FIGS. 8B, 8C illustrate band diagrams of the bistable diode in both states at zero bias and a forward bias.
Figure 8C:
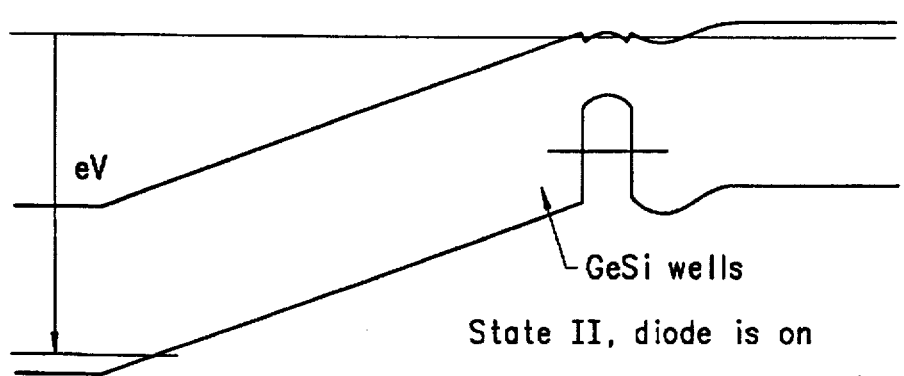

The $\delta$-doped tunnel junction is a critical feature of the bistable diode which plays an important role in controlling the transport of carrier in order to achieve the novel bistable characteristics shown in FIG. 7. The mechanism is illustrated in FIG. 8 with the aid of the band diagrams of the bistable diode in both states. In state I, the p+ and n+ $\delta$-doped layers are in quasi-equilibrium and their Fermi energy are similar as shown in FIG. 8(a). It is a completely off state because the electron and hole currents are both blocked by the conduction band barrier located in the GeSi well region 62-1 and the GeSi/Si (62-1, 62-2) band offset barriers of the superlattice, respectively. However, as the bias approaches $V_{off}$ (3.2 V), the hole injection will increase and reach to the maximum current through the tunnel junction. Further increasing the external bias will result in an over injection of holes and an accumulation of holes and an accumulation of holes in the GeSi well at the center of which the p+ $\delta$-doped layer is placed. These holes will neutralize the inner field of the tunnel junction and switch the band alignment into a normal forward p-n junction as shown by FIG. 8(b). In the new state, the electron barrier located at the GeSi well region 62-1 is eliminated, and the conductance of the diode increases drastically, leading to the transition of the I–V characteristics of the diode from branch I to branch II.

Optimization of the $\delta$-doped tunnel diode will help improving characteristics of the bistable diode as well as the simplified SRAM cell. The minimum doping density of the p+ and n+ $\delta$-doped layers, N, depends on the thickness of the spacer between the two layers, d, and the germanium fraction of the GeSi well, which determines the valence band offset between silicon and the GeSi well, $\Delta V_v$. Under the $\delta$-doping approximation, we have $$N = \epsilon_0 \epsilon_{si}(E_g - \Delta V_v)/(e^2 d) \quad (1)$$

where e is the electron charge, $E_g$ the band gap of silicon, $\epsilon_0$ and $\epsilon_{si}$ the permittivity of free space and the dielectric constant of silicon, respectively. Accordingly to (1), the 2D density of the $\delta$-doped layers is within the range from $4\times10^{12}$ to $2\times10^{13}$, depending on the value of d and $\Delta V_v$.

The structure shown in FIG. 6 is by and large the same as that shown in FIG. 5. The major modification in FIG. 6 is that the GeSi/Si superlattice 62 in FIG. 5 is replaced by a Ge$_x$Si$_{1-x}$ sawtooth multiple well structure 63 in order to obtain a better speed response and a strained GeSi layer 53 replaces the heavily doped p-region 52. The number of the sawtooth wells can be adjusted to achieve a better trade-off between $V_{off}$ and the amplitude of the negative pulse needed to trigger the diode from the ON-state to the OFF-state. Indeed, switching of the bistable diode from the OFF-state to the ON-state can be very fast for either of the structures shown in FIG. 5 and 6 if the certain amount of holes needed to accumulate in the p+ $\delta$-doped layer can be injected by a positive trigger pulse. In this case the switching speed of the diode from the OFF-state to the ON-state is dominated by the external circuit and the interval delay of the diode will be in the order of $10^{-11}$ sec, because only the majority carrier relaxation is involved.

On the other hand, as the diode is switched from the ON-state to the OFF-state, the switching speed depends on how fast the accumulated holes in the well can be extracted. The sawtooth well structure of FIG. 6 will provide a path for these holes to escape from the tunnel junction to the p-type region when a negative pulse is applied. It is estimated that the switching time for the sawtooth well triggered by an appropriate negative pulse will be less than $10^{-10}$ sec.

Figure 9A:
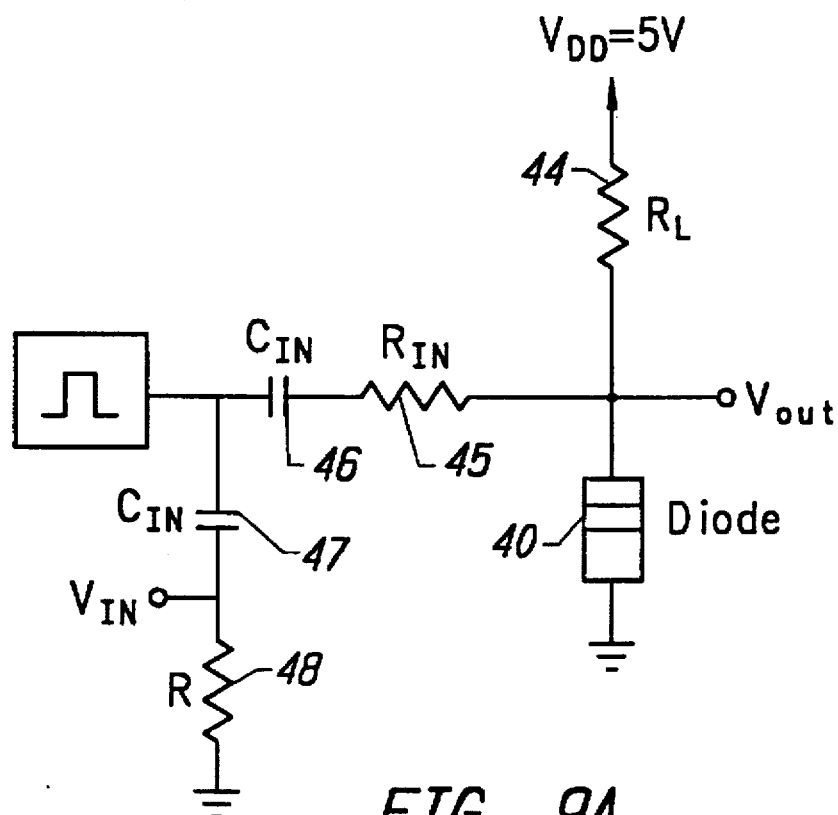
FIGS. 9A, 9B illustrate a test circuit schematic and waveforms therein for positive and negative trigger pulses.
Figure 9B:
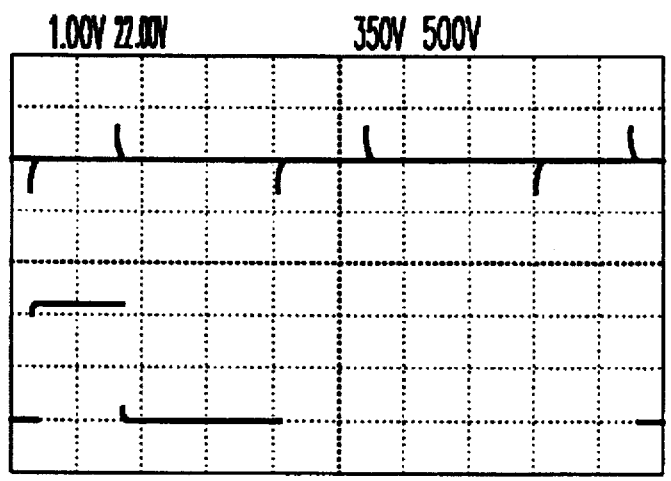

For low voltage application (1.5 V, for example), a smaller voltage drop $V_{on}$ of state II is needed. To lower $V_{on}$, a heavily p-type doped strained GeSi layer 53 is inserted on top of the silicon p-type region 50 as shown in the bottom of FIG. 6. The p+ GeSi layer works as a sub-collector for electrons drifting from the n-type region. By this way, a low $V_{on}$ of 0.3–0.5 V is achievable by reducing the Fermi energy difference between the p-type region and the n-type region. The new SRAM cell in accordance with the invention has been demonstrated using a bistable diode as the storage element and a test circuit which is principally equivalent to the SRAM cell. Shown in FIG. 9(a) is the circuit diagram of the equivalent cell. The gate transistor is replaced by series resistor 45 and capacitor 46. An input signal is applied at the common terminal of series capacitor 47 and resistor 48. As illustrated by the operational characteristics shown in FIG. 9(b), a successful operation has been achieved. The stored waveform ($V_{out}$) displayed in the bottom depicts an output swing close to 3 V which is large enough for the read out operation of an SRAM. The constant level of the stored waveform between two trigger pulses reveals the static nature of the memory cell.

The area of the new SRAM cell is comparable with that of the DRAM cell with the same line width technology. This is because the bistable diode occupies only a square of the feature dimension and can be placed at the drain region of the gate MOSFET without increasing its area significantly. Further, the load elements needs little additional area, because it can be fabricated on the top of other devices. Such a high density, in combination with the low power dissipation characteristics of the new cell will support a giga-bit SRAM using a 0.3μ technology. As the line width is shrunk further, the bit density of an SRAM with the same chip area will increase quadratically, but the power dissipation of the cell array will remain unchanged because the total diode area is the same. Another fundamental advantage of the new SRAM cell is its technological compatibility with the current CMOS technology. The growth of the diode structure and its fabrication can be performed at temperatures less than 850° C. Therefore, the fabrication of the bistable diode array can be arranged in the metallization stage during the CMOS fabrication, causing no degradation of the CMOS devices.

Figure 10:
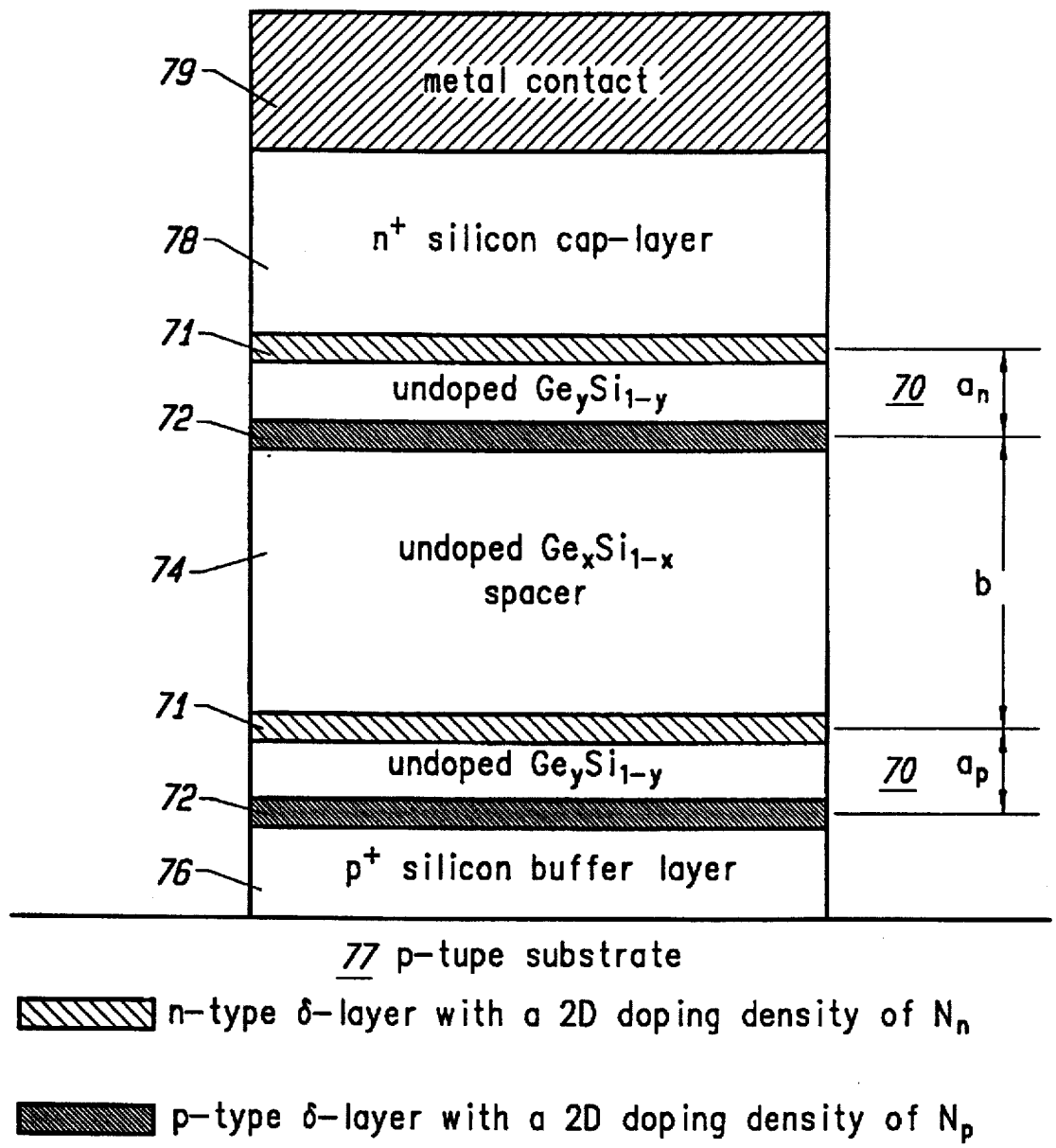
FIG. 10 illustrates the structure of a bistable diode in accordance with another embodiment of the invention.

FIG. 10 illustrates another embodiment of the bistable diode. In this structure, another tunnel junction 70 is introduced to replace the GeSi/Si (62-1, 62-2) superlattice in the first structure. The merits gained from the modification are a better performance of the device, a larger technological tolerance for fabrication, and a clearer formulation for the characteristics of the device. The modification does not change any of the functional features of the device relevant to the SRAM application.

In FIG. 10 two tunnel junctions 70 are put adjacent to the p-type and n-type electrodes of the diode, respectively. Each tunnel junction 70 includes an n-type δ-layer 71 with 2D doping of $N_n$ and a p-type δ-layer 72 with 2D doping of $N_p$. Between the two tunnel junctions is an undoped spacer 74 with a thickness of b. As in the previous structure, each of the two tunnel junctions is composed of a pair of p+ and n+ δ-doping layers. The distance between the coupled δ-doped layers, $a_p$ and $a_n$, are both smaller than b. A GeSi layer can be incorporated in the spacer regions for the purpose of reducing the maintaining current and voltage of the "on" state. P+ buffer layer 76 is found on substrate 77, n+ section cap-layer 78 is formed above the upper tunnel junction 71, and metal contact 79 is formed on layer 78. Measurements performed for this new modified structure have shown a bistability and other features exactly similar to those observed in the earlier bistable diode. Thus, the bistable I-V curve in FIG. 7 of the main document is also a representative characteristic of the new structure.

Figure 11A:
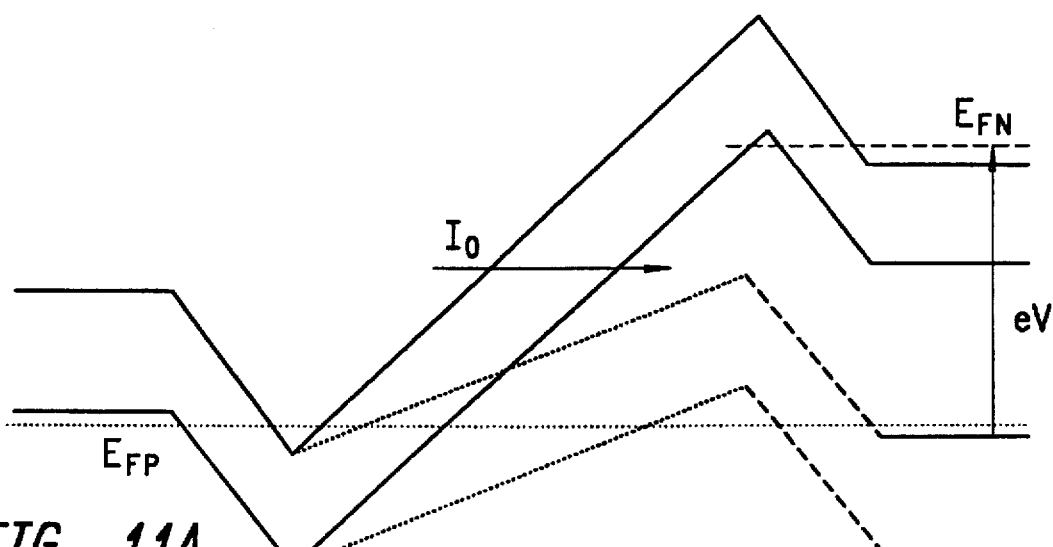
FIGS. 11A–11C illustrate "off" and "on" states for the illustrated bistable diode having two δ-doped tunnel junctions.
Figure 11B:
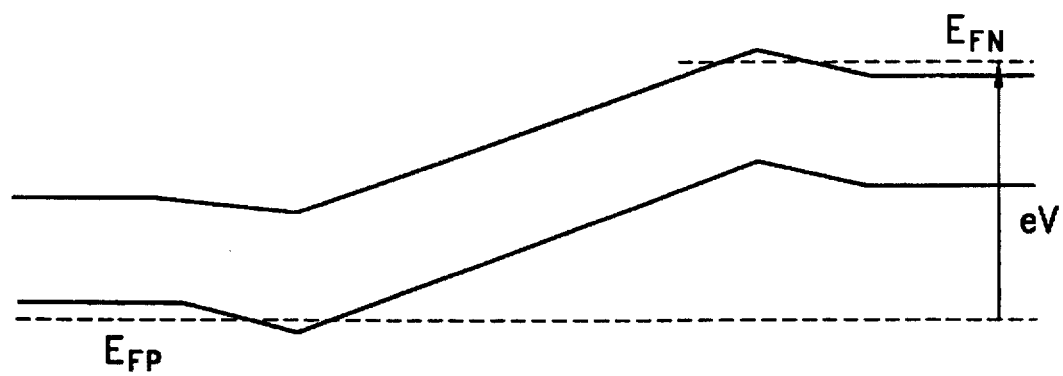
Figure 11C:
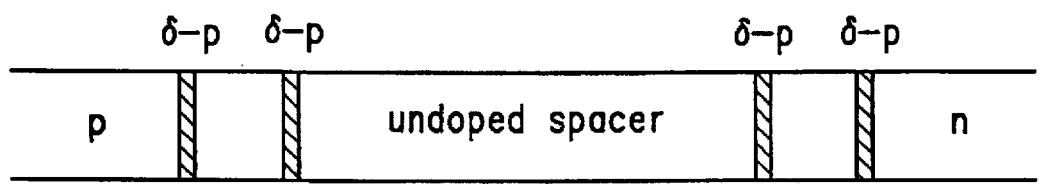

Two band diagrams shown in FIGS. 11A and 11B are used to explain the bistability of the new modified structure. FIG. 11A depicts the "off" state of the diode under a zero bias (gray lines) and a forward bias V (dark lines). In this state, the two tunnel junctions shown in FIG. 11C are both in a "tunneling" status, and the drastic band bending in the tunnel junctions forms a hole barrier and an electron barrier, respectively. These barriers block all the hole and electron currents from the p- and n-regions, thus set the diode in the "off" state. The observed "off" state leakage current $I_0$ of the diode mostly comes from the interband tunneling occurring in the central spacer. Since most of the bias drops across the spacer, this tunneling current is an exponential function of the applied bias. For small values of V, $I_0$ is negligible, and the small amount of electrons and holes generated in the interband tunneling can easily flow out of the diode via the two tunnel junctions. However, as the forward bias increases to a certain point, $I_0$ will be too large to flow through one of the two tunnel junctions. At that point, carriers will accumulate in one of the δ-doped layers of the tunnel junction where the restriction for $I_0$ occurs first. As illustrated above, accumulation of carriers in the δ-doped layers will remove the lining up of the quasi Fermi levels of the two δ-doped layers in the tunnel junction, and cause a band alignment switching from the "off" state to the "on" state. The new band diagram is shown in FIG. 11B.

With a similar bistability, the new modified structure provides some additional advantages over the first structure of the bistable diode. First, the "off" state current, $I_0$, and the transition voltage $V_{off}$ of the new structure has a smaller temperature dependence, coming from the tunneling nature of $I_0$. The transition voltage, $V_{off}$ can be easily evaluated as $$V_{off} \sim (b/a) E_g / q \quad (2)$$

where a is the minor of $a_p$ and $a_n$, Eg the band gap and q the electron charge. In the first structure, $V_{off}$ depends on the breakthrough of a complex transport process, in which both tunneling and thermal activation are involved, thus has a strong temperature dependence. For this reason, $V_{off}$ of the first structure can not be evaluated using a simple equation as the above equation (1) for the new modified structure.

Figure 12:
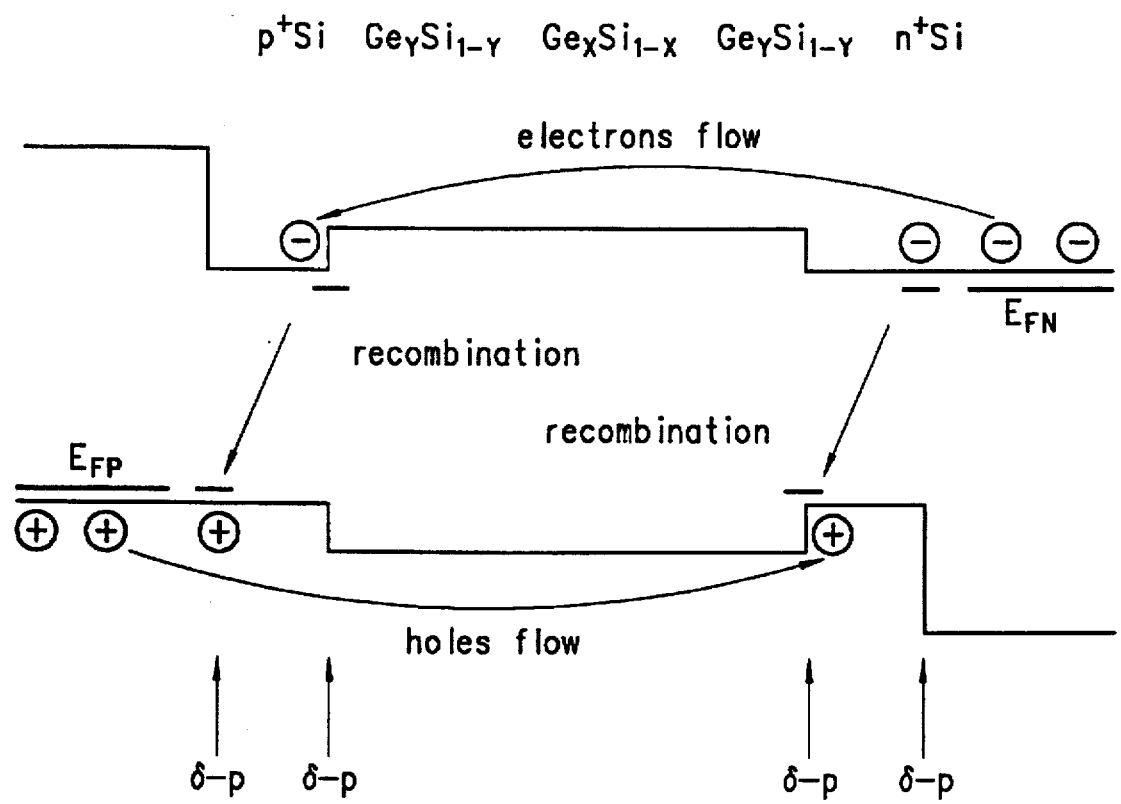
FIG. 12 illustrates Fermi levels in the bistable diode.

With introduction of appropriate germanium fractions, x and y, to the new modified structure, a reduced maintaining current and voltage of the "on" state can be obtained. Shown in FIG. 12 is a schematic of the quasi Fermi levels of the diode and a simplified band alignment of the heterostructure in the "on" state. The Two δ-doped layers in each tunnel junction have different Fermi levels. The Fermi levels of the p-type δ-doped layers in the two tunnel junctions both line up with that of the p-region; while the Fermi levels of the n-type δ-doped layers in the two tunnel junctions both line up with that of the n-region. In the first structure, the maintaining current contains one recombination current component and another much larger thermal diffusion current component. While in the new modified structure, the maintaining current is mainly the recombination current, as shown in FIG. 12. Due to the band offset and shift between the Si regions and the GeSi regions, the thermal component is largely suppressed.

In summary, a new SRAM cell utilizing a bistable diode in accordance with the invention is superior to the present CMOS SRAM cell in achieving high density. Meanwhile, the speed and dissipation characteristics of the new cell also meet the requirements of a high speed SRAM. The SRAM cell array can be integrated readily with CMOS periphery circuits. This innovation will provide a way to increase the bit density of the SRAM chips readily and will make the capacity of an SRAM approach to that of a DRAM. It will have a major impact on SRAM memory market and computer architecture design.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A static random access memory (SRAM) cell comprising:
   a word line,
   a bit line,
   a bistable diode and a load device serially connectable between two voltage potentials, said bistable diode and said load device having a common terminal, said bistable diode including a GeSi/Si superlattice and a δ-doped tunnel junction; and
   an electronic gate device connected between said bit line and said common terminal, said gate device having a control terminal connected to said word line.

2. The cell as defined by claim 1 wherein said electronic gate device comprises a field effect transistor.

3. The cell as defined by claim 1 wherein said load device comprises a resistor.

4. The cell as defined by claim 1 wherein said load device comprises a depletion mode field effect transistor.

5. The cell as defined by claim 1 wherein said δ-doped tunnel junction comprises a pair of closely spaced p+ and n+ δ-doped layers and an n-doped semiconductor region.

6. A static random access memory (SRAM) cell comprising:
   a word line,
   a bit lined,
   a bistable diode and a load device serially connectable between two voltage potentials, said bistable diode and said load device having a common terminal, said bistable diode including at least one δ-doped tunnel junction; and
   an electronic gate device connected between said bit line and said common terminal, said gate device having a control terminal connected to said word line.

7. The cell as defined by claim 6 wherein each tunnel junction includes an n-type δ-doped layer and a p-type δ-doped layer.

8. For use in a memory cell having a storage device serially connected with a load device between two voltage terminals;
   said storage device comprising a bistable diode including a semiconductor body including spaced p-doped and n-doped anode and cathode regions and a GeSi/Si superlattice and a δ-doped tunnel junction between said regions.

9. The bistable diode as defined by claim 8 wherein said δ-doped tunnel junction comprises a pair of closely spaced p+ and n+ δ-doped layers adjacent to said δ-doped region.

10. For use in a memory cell having a storage device serially connected with a load device between two voltage terminals;
    said storage device comprising a bistable diode including a semiconductor body including spaced p-doped and n-doped regions and a $Ge_xSi_{1-x}$ multiple well structure between said regions.

11. For use in a memory cell having a storage device serially connected with a load device between two voltage terminals, said storage device comprising a bistable diode including a semiconductor body including spaced p-doped and n-doped regions and at least one δ-doped tunnel junction between said regions.

12. The cell as defined by claim 11 wherein each tunnel junction includes an n-type δ-doped layer and a p-type δ-doped layer.

* * * * *